(12) United States Patent
Ruckerbauer

(10) Patent No.: US 6,438,057 B1
(45) Date of Patent: Aug. 20, 2002

(54) DRAM REFRESH TIMING ADJUSTMENT DEVICE, SYSTEM AND METHOD

(75) Inventor: Hermann Ruckerbauer, Moos (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 09/900,626

(22) Filed: Jul. 6, 2001

(51) Int. Cl.$^7$ .............................................. G11C 7/00
(52) U.S. Cl. ........................................ 365/222; 365/211
(58) Field of Search ................................. 365/222, 211, 365/228

(56) References Cited

U.S. PATENT DOCUMENTS

| | | | | |
|---|---|---|---|---|
| 5,278,796 A | * | 1/1994 | Tillinghast et al. | 365/211 |
| 5,532,968 A | * | 7/1996 | Lee | 365/222 |
| 5,784,328 A | * | 7/1998 | Irrinki et al. | 365/222 |
| 5,873,053 A | * | 2/1999 | Pricer et al. | 702/130 |
| 2001/0026491 A1 | * | 10/2001 | Bohm et al. | 365/222 |

OTHER PUBLICATIONS

Sybil P. Parker, "Electronics and Computers," McGraw–Hill Encyclopedia of Electronics and Computer 2nd ed., pp. 850–854, (1988).

"Memory Access and Access Time," www.pcguide.com/ref/ram/timingAccess–c.html, pp. 1–3, (Apr. 17, 2001).

"Dynamic RAM (DRAM)," www.pcguide.com/ref/ram/typesDRAM–c.html, pp. 1–2, (Apr. 17, 2001).

"Asynchronous and Synchronous DRAM," www.pcguide.com/ref/ram/timingAsynch–c.html, p. 1, (Apr. 17, 2001).

"DRAM Technologies," www.pcguide.com/ref/ram/tech––c.html, p. 1, (Apr. 17, 2001).

"Processor Manufacturing," www.pcguide.com/ref/cpu/char/mfg–c.html, p.1.

Tony Smith, "Micron launches low–power SDRAM," www.theregister.co.uk/content/archive/16841.html, p. 1, Feb. 12, 2001.

* cited by examiner

Primary Examiner—Vu A. Le
(74) Attorney, Agent, or Firm—Lerner, David, Littenberg, Krumholz & Mentlik, LLP

(57) ABSTRACT

An apparatus includes at least one dynamic random access memory (DRAM) array; and at least one temperature sensor in thermal communication with the DRAM array and operable to produce a signal indicative of a temperature of the DRAM array.

17 Claims, 5 Drawing Sheets

DRAM REFRESH TIMING ADJUSTMENT DEVICE, SYSTEM AND METHOD

BACKGROUND OF THE INVENTION

The present invention relates to devices, systems, and/or methods for refreshing the contents of a dynamic random access memory (DRAM) array and, more particularly, to devices, systems, and/or methods for utilizing a temperature of the DRAM array to adjust a refresh rate at which the contents of the DRAM array are updated.

A common form of random access memory (RAM) is dynamic random access memory (DRAM). With reference to the equivalent circuit shown in FIG. 1, DRAMs employ a semiconductor technology called complementary metal-oxide-semiconductor CMOS to implement a memory array 10 including a plurality of memory cells 12, each cell 12 consisting of a single transistor 14 and a single capacitor 16. A given cell 12 of the DRAM array 10 may be accessed by activating a particular bit line and word line. As the cells 12 of the DRAM array are arranged in a grid, only one cell 12 will be accessed for each combination of word line and bit line.

For example, in order to write a data bit into cell (0,1), word line 0 is activated by applying an appropriate voltage to that line, e.g., a logic high (such as 3.3V, 5V, 15V, etc.) or a logic low (such as 0V). The appropriate voltage on word line 0 will turn on each of the transistors 14 connected to that line including the transistor 14 of cell (0,1). A voltage may then be presented on bit line 1, which will charge the capacitor 16 of cell (0,1) to a desired level, e.g., a logic high or logic low consistent with the data bit. The voltage may be presented on bit line 1 (and/or any of the other bit lines) by way of a suitably connected data bus. When the voltage on word line 0 is removed, the transistor 14 of cell (0,1) is biased off and the charge on the capacitor 16 of cell (0,1) is stored.

Reading a data bit from a particular cell 12, such as cell (0,1), is substantially similar to writing a data bit except that the voltage on bit line 1 is imposed by the capacitor 16 of the cell 12 rather than by the data bus. Typically, a single cell 12 is not written to or read from; rather, an entire word (series of data bits) is written into the DRAM array 10 or read from the DRAM array 10 by applying the appropriate voltage on a particular word line and either imposing or sensing voltage on each of the bit lines 0,1,2, etc.

Once data bits (i.e., voltages) have been stored on the capacitors 16 of the DRAM array 10, the data are not permanent. Indeed, various leakage paths exist around the capacitors 16 and, therefore, failure to read the date may corrupt the stored voltages. In order to avoid the loss of data stored in the DRAM array 10, the data are refreshed on a periodic basis. In particular, an external sense amplifier is employed to sense the data stored in the DRAM array 10 and rewrite (i.e., refresh) the data onto the capacitors 16. Typically, the data associated with a particular word line (i.e., one data word) are refreshed every 7.8 microseconds (e.g., for 256 Mbit DRAM arrays) or every 15.6 microseconds (e.g., for 64 Mbit DRAM arrays). The refresh rate for a particular DRAM array 10 is established by the manufacturer and is based on a worst-case high temperature condition.

The refresh process may be implemented in either of two ways, namely, internally (self refresh) or externally (CBR or Ras only refresh). The internal refresh process requires that the DRAM itself set the refresh timing. The external refresh process requires an external chip (chipset) that issues a refresh command. The DRAM receives the refresh command from the external chip through a dedicated pin.

Unfortunately, the refresh process has a deleterious effect on overall system performance. Among these deleterious effects are: (i) an increase in power consumed by the DRAM array 10 and any external circuitry involved in the refresh process; and (ii) a decrease in overall system bandwidth. As to the former, the external sense amplifiers and other associated circuitry (e.g., row decoders, column decoders, etc.) involved in the refresh process, not to mention the DRAM array 10 itself, draw power in order to rewrite the data into the DRAM array 10. In certain applications, such as in the automotive industry, power efficiency is desirable and increases in power consumption due to DRAM array 10 refresh cycles may be problematic. As to the latter, the refresh cycles of the DRAM array 10 take priority over routine reading and writing cycles and, therefore, the rate at which the DRAM array 10 is refreshed has a corresponding impact on the bandwidth (e.g., data throughput) of the overall system in which the DRAM array 10 is utilized.

Accordingly, there is a need in the art for a new device, system, and/or method for refreshing the data of a DRAM array such that power consumption is reduced and system bandwidth is increased.

SUMMARY OF THE INVENTION

In accordance with at least one aspect of the present invention, an apparatus includes: at least one DRAM array; and at least one temperature sensor in thermal communication with the DRAM array and operable to produce a signal indicative of a temperature of the DRAM array.

Preferably, the DRAM array is refreshed at a rate that varies in response to the signal. For example, the rate at which the DRAM array is refreshed may decrease as the temperature of the DRAM array decreases. Further, the rate at which the DRAM array is refreshed may increase as the temperature of the DRAM array increases.

Preferably, the at least one temperature sensor includes at least one diode having a forward voltage drop that varies as a function of the temperature of the DRAM array, and the signal corresponds to the forward voltage drop of the at least one diode. Alternatively, the at least one temperature sensor may be taken from the group consisting of thermocouples, thermistors, or any other device that provides an output signal that varies as a function of temperature.

In accordance with one or more further aspects of the invention, the apparatus may further include a refresh unit operable to refresh the DRAM array at a rate that varies in response to the signal. Preferably, the refresh unit includes a refresh timing unit operable to establish the rate at which the DRAM array is refreshed in response to the signal. It is preferred that the refresh timing unit is operable to decrease the rate at which the DRAM array is refreshed as the signal indicates that the temperature of the DRAM array decreases. It is also preferable that the refresh timing unit is operable to increase the rate at which the DRAM array is refreshed as the signal indicates that the temperature of the DRAM array increases.

When the at least one temperature sensor is a diode, it is preferable that the refresh unit is operable to sense the forward voltage drop of the diode to determine the temperature of the DRAM array.

In accordance with one or more further aspects of the present invention, the DRAM array and the at least one temperature sensor are disposed in a semiconductor package, the package including at least one connection pin operable to provide the signal to external circuitry.

In accordance with one or more further aspects of the invention, the DRAM array, the at least one temperature sensor, and the refresh unit are integrated in a semiconductor package.

In accordance with at least one further aspect of the present invention, the apparatus includes: at least one DRAM chip including the DRAM array and the at least one temperature sensor; at least one refresh chip operable to refresh the DRAM array at a rate that varies in response to the signal. Preferably, the refresh chip includes the refresh timing unit.

In accordance with one or more further aspects of the present invention, a method includes: sensing a temperature of a DRAM array; and refreshing contents of the DRAM array at a rate that varies in response to the temperature thereof.

The method preferably further includes decreasing the rate at which the DRAM array is refreshed as the temperature of the DRAM array decreases. The method may also include increasing the rate at which the DRAM array is refreshed as the temperature of the DRAM array increases. It is most preferred that the step of sensing the temperature of the DRAM array includes sensing a forward voltage drop of a diode that is in thermal communication with the DRAM array.

Other aspects, features, advantages, etc. will become apparent to one skilled in the art in view of the description herein taken in combination with the accompanying drawings.

BRIEF DESCRIPTION OF THE DRAWINGS

For the purposes of illustrating the invention, there are shown in the drawings forms which are presently preferred, it being understood, however, that the invention is not limited to the precise arrangements and/or instrumentalities shown.

DETAILED DESCRIPTION

Figure 2:
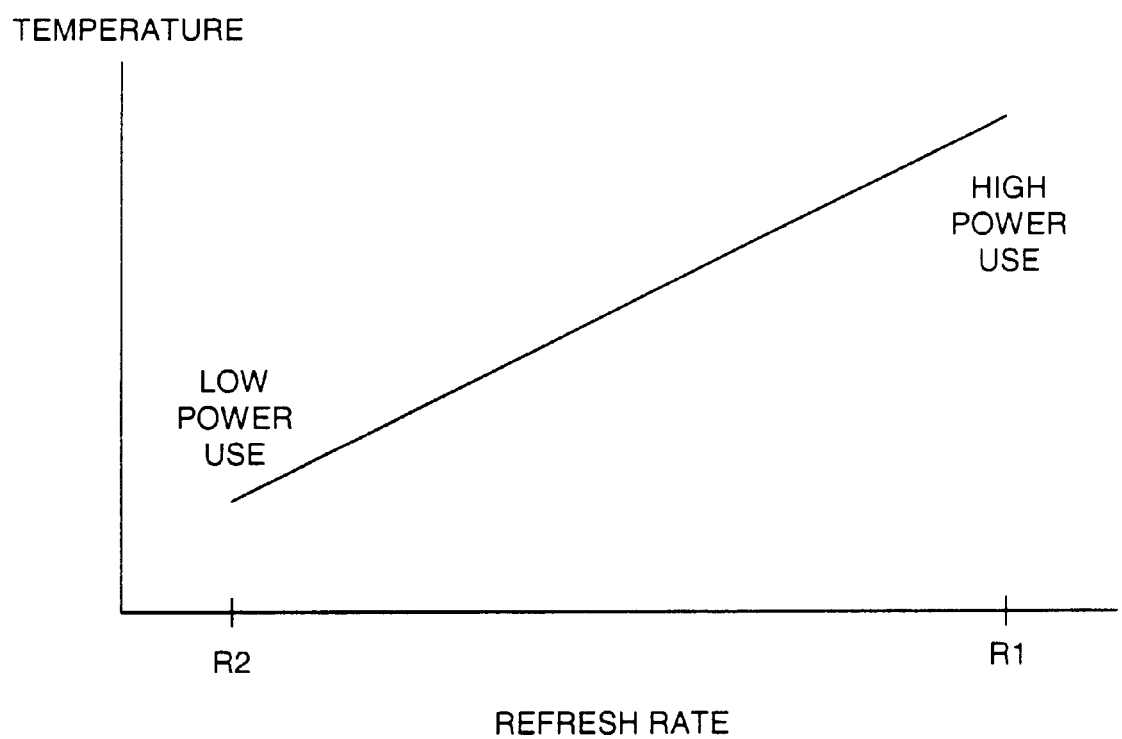
FIG. 2 is a graph illustrating the relationship between a temperature of the DRAM array and a desirable refresh rate of the DRAM array.

With reference to FIG. 2, it has been found that the refresh rate established by DRAM array manufacturers may be altered when the temperature of the DRAM array is lower than a worst-case value. For example, when the temperature of the DRAM array is relatively high, a correspondingly high refresh rate R1 may be required to ensure integrity of the data stored in the DRAM array. The relatively high refresh rate R1 unfortunately results in a correspondingly high power use and a low system bandwidth. Conversely, when the temperature of the DRAM array is relatively low, it has been found that a correspondingly lower refresh rate R2 may be utilized to ensure the integrity of the data stored in the DRAM array. Advantageously, the relatively lower refresh rate R2 results in a lower power usage and higher overall system bandwidth. Although the relationship between the temperature and the refresh rate of the DRAM array is illustrated as being a linear function in FIG. 2, it is noted that the relationship may not be linear and may vary depending on the specific implementation of the DRAM array. It is believed, however, that the overall relationship between temperature and refresh rate for DRAM arrays will exhibit a positive slope. In accordance with one or more aspects of the present invention, this relationship is exploited to reduce power consumption of the DRAM array (and any associated circuitry) and improve overall system bandwidth.

Figure 1:
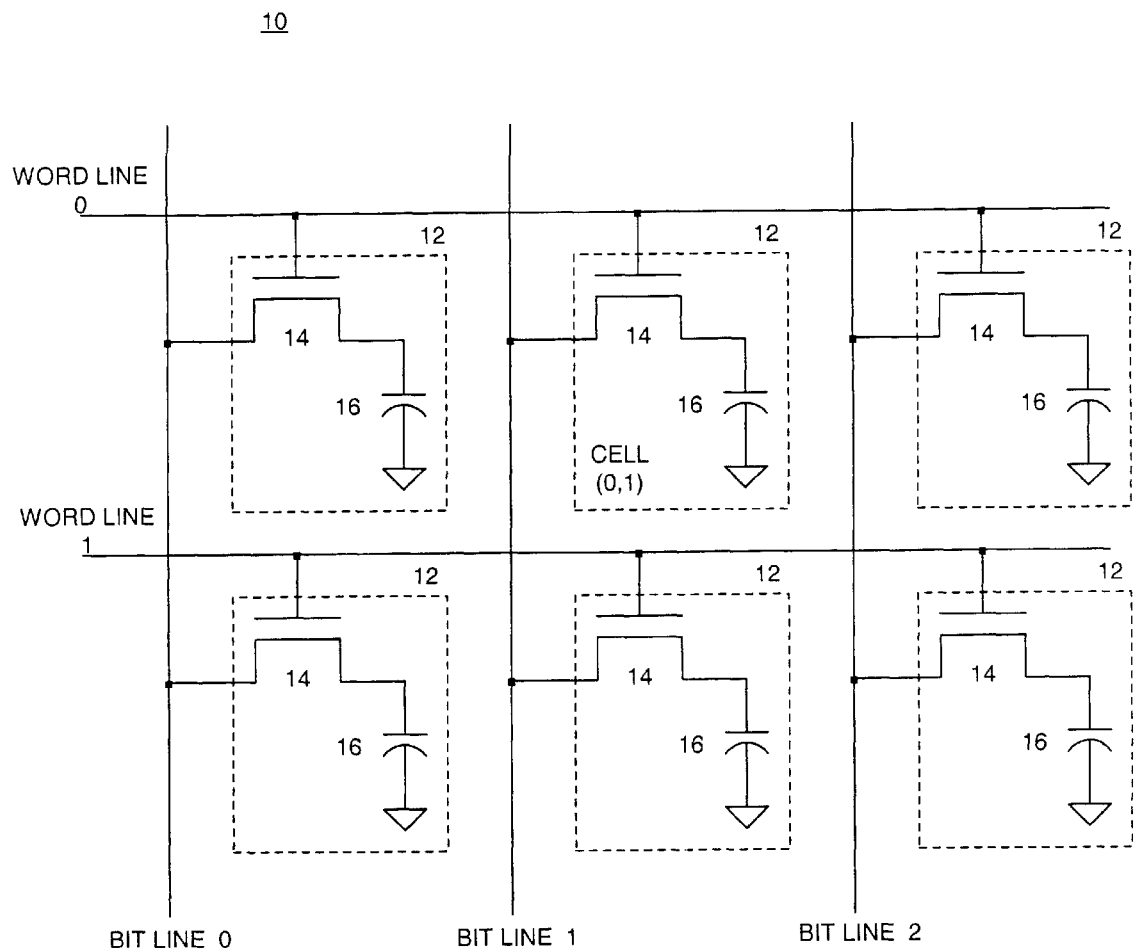
FIG. 1 is a DRAM array in accordance with the prior art.
Figure 3:
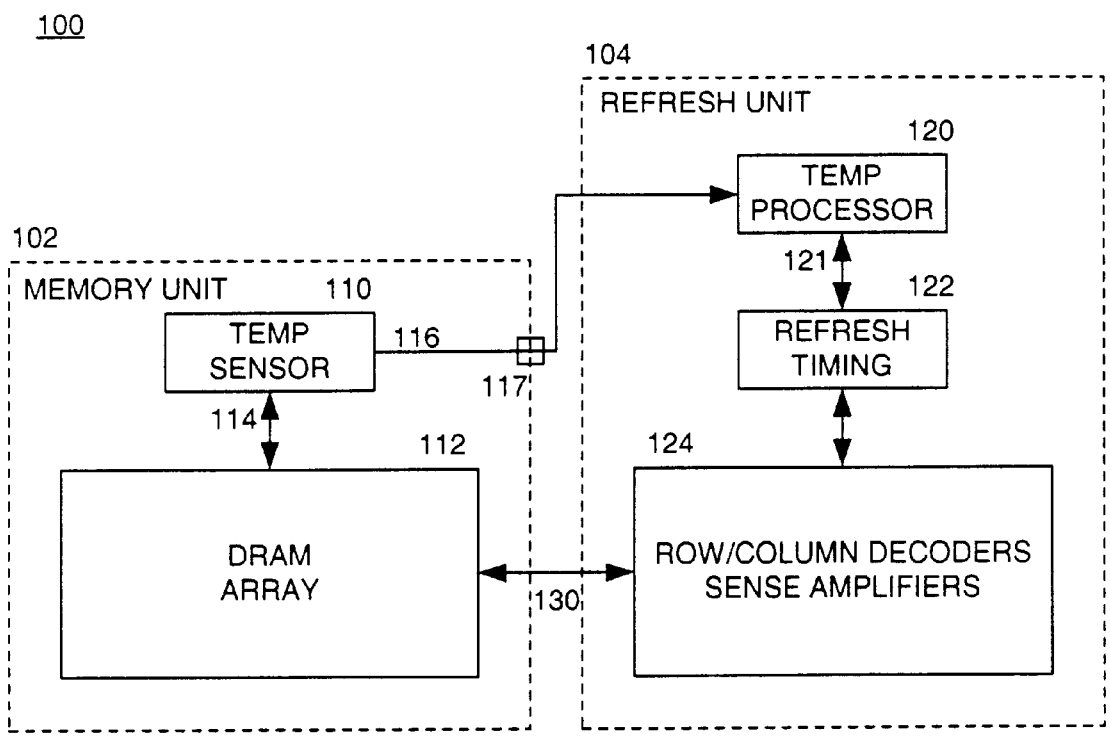
FIG. 3 is a block diagram of a DRAM apparatus in accordance with one or more aspects of the present invention.

FIG. 3, is a block diagram of a system 100 for storing data in a DRAM array. The system 100 includes a memory unit 102 and a refresh unit 104. The memory unit 102 preferably includes at least one temperature sensor 110 and at least one DRAM array 112. The DRAM array 112 may be configured in a substantially similar way as shown in FIG. 1 and/or may be configured in accordance with any of the known technologies. Preferably, the temperature sensor 110 is in thermal communication with the DRAM array 112 (schematically illustrated by way of line 114) and is operable to produce a signal on line 116 that is indicative of a temperature of the DRAM array 112. By way of example, the DRAM array 112 may be implemented on a semiconductor chip and the temperature sensor 110 may be thermally coupled to the same semiconductor chip or to an intermediate member that is in thermal communication with the semiconductor chip.

The refresh unit 104 preferably includes a temperature processor 120, a refresh timing unit 122, and a decoder/amplifier unit 124. The refresh unit 104 is preferably operable to refresh the DRAM array 112 (by way of connection 130) at a rate that varies in response to the signal on line 116. More particularly, the DRAM array 112 is preferably refreshed at a rate that decreases as the temperature of the DRAM array 112 decreases and/or refreshed at a rate that increases as the temperature of the DRAM array 112 increases. The temperature processor 120 is preferably operable to detect a level of the signal on line 116 and to provide an indication of the temperature (by way of line 121) of the DRAM array 112 to the refresh timing unit 122. The refresh timing unit 122 is preferably operable to establish the rate at which the DRAM array 112 is refreshed in response to the temperature indication from the temperature processor 120. The row/column decoders and sense amplifiers 124 are preferably operable to perform the refresh function on the DRAM array 112 in accordance with known techniques at intervals dictated by the refresh timing unit 122.

In accordance with at least one aspect of the present invention, the temperature sensor 110 and the DRAM array 112 are preferably disposed in a semiconductor package where the package includes at least one connection pin 117 operable to provide the signal on line 116 to external circuitry, such as the refresh unit 104. In accordance with a further aspect of the present invention, the DRAM array 112, temperature sensor 110, and the refresh unit 104 are integrated in the same semiconductor package such that external circuitry is not required to perform the refresh function. In accordance with a further aspect of the present invention, the refresh unit 104 is implemented by way of one or more semiconductor packages so as to form a chipset with the package containing the temperature sensor 110 and the DRAM array 112.

Figure 4A:
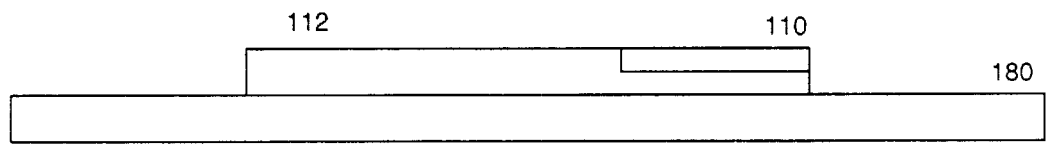
FIGS. 4A–4C are structural views of alternative DRAM configurations in accordance with the present invention.
Figure 4B:
Figure 4C:
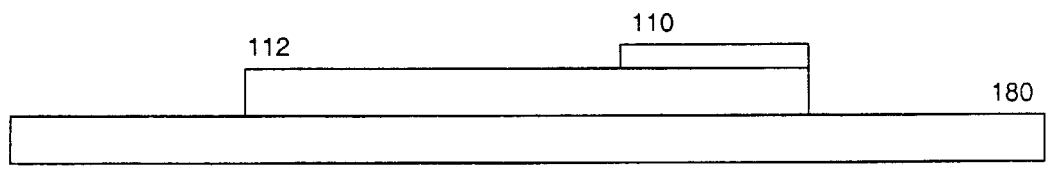

Reference is now make to FIGS. 4A–4C, which are structural views of alternative configurations of the DRAM array 112 and temperature sensor 110. In FIG. 4A, the DRAM array 112 is disposed on an intermediate member 180, such as a substrate, a heatsink, etc. The temperature sensor 110 is integrated with the DRAM array structure 112, such as by implementing the temperature sensor 110 into the semiconductor material of the DRAM array 112. As shown in FIG. 4B, an alternative structural configuration is contemplated where the DRAM array 112 and the temperature sensor 110 are disposed on the intermediate member 180, where the intermediate member 180 exhibits desirable thermal conductivity properties. Indeed, in this configuration it is preferred that the intermediate member 180 exhibits a low thermal resistance between the DRAM array 112 and the temperature sensor 110 such that an accurate measurement of the temperature of the DRAM array 112 may be obtained. The structural configuration shown in FIG. 4C shows that the temperature sensor 110 may be coupled to the semiconductor device 112, such as by bonding it to the semiconductor material of the DRAM array 112.

Figure 5:
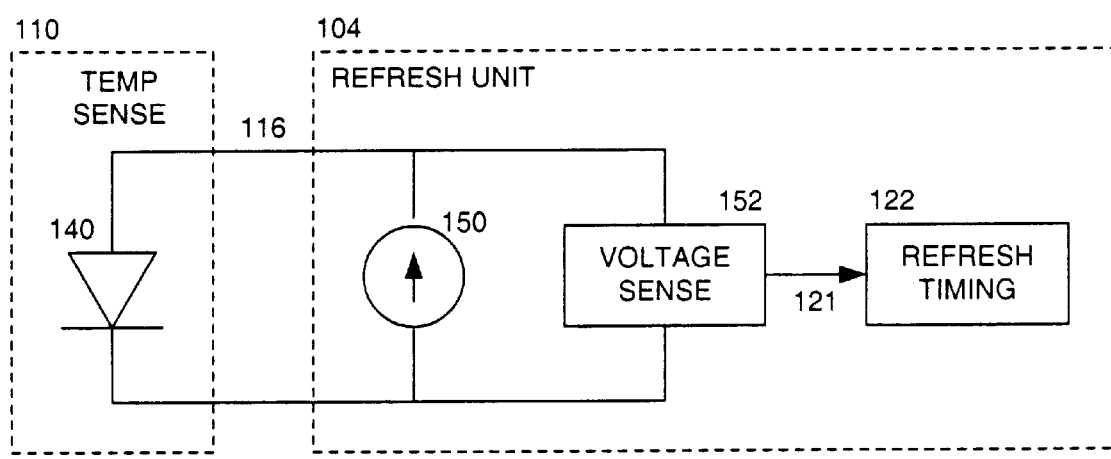
FIG. 5 is a block diagram showing additional details of certain components of FIG. 3.

With reference to FIG. 5, the temperature sensor 110 preferably includes at least one diode 140 having a forward voltage drop that varies as a function of the temperature of the DRAM array 112. The signal on line 116 preferably corresponds to the forward voltage drop of the diode 140. By way of example, the refresh unit 104 may include a current source 150 operatively coupled to the diode 140 such that the diode 140 is forward biased. The refresh unit 104 may also include a voltage sensor 152 operatively coupled across the diode 140 such that the forward voltage drop across the diode 140 may be measured. The voltage sensor 152 preferably produces a value on line 121 indicative of the temperature of the DRAM array 112 vis-a-vis the forward voltage drop of the diode 140.

Although the use of diode 140 is preferred, various other temperature sensing devices and techniques may be employed, such as the use of one or more thermocouples, thermistors, etc.

In accordance with at least one further aspect of the present invention, a method of refreshing the contents of a DRAM array may be achieved utilizing suitable hardware, such as that illustrated in FIGS. 3–5 and/or utilizing a manual or automatic process. An automatic process may be implemented using any of the known processors that are operable to execute instructions of a software program. In either case, the steps and/or actions of the method preferably correspond to the functions described hereinabove with respect to at least portions of the hardware shown in FIGS. 3–5.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. An apparatus, comprising:
a semiconductor package including at least one connection pin;
at least one dynamic random access memory (DRAM) array disposed within the package; and
at least one temperature sensor in thermal communication with the DRAM array, operable to produce a signal indicative of a temperature of the DRAM array, and coupled to the at least one connection pin such that the signal may be provided to external circuitry,
wherein the DRAM array is refreshed at a rate that decreases as the temperature of the DRAM array decreases and that increases as the temperature of the DRAM array increases.

2. The apparatus of claim 1, wherein the at least one temperature sensor includes at least one diode having a forward voltage drop that varies as a function of the temperature of the DRAM array, and the signal corresponds to the forward voltage drop of the at least one diode.

3. The apparatus of claim 1, wherein the at least one temperature sensor is taken from the group consisting of thermocouples and thermistors.

4. The apparatus of claim 1, wherein the at least one temperature sensor includes a diode having a forward voltage drop that varies as a function of the temperature of the DRAM array; the at least one connection pin includes a first pin coupled to an anode of the diode and a second pin coupled to a cathode of the diode; and the signal corresponds to a potential voltage between the first and second pins.

5. The apparatus of claim 1, wherein the at least one temperature sensor is taken from the group consisting of thermocouples and thermistors.

6. The apparatus of claim 1, further comprising a refresh unit operable to refresh the DRAM array at a rate that varies in response to the signal.

7. The apparatus of claim 6, wherein the refresh unit includes a refresh timing unit operable to establish the rate at which the DRAM array is refreshed in response to the signal.

8. The apparatus of claim 7, wherein the refresh timing unit is operable to decrease the rate at which the DRAM array is refreshed as the signal indicates that the temperature of the DRAM array decreases.

9. The apparatus of claim 7, wherein the refresh timing unit is operable to increase the rate at which the DRAM array is refreshed as the signal indicates that the temperature of the DRAM array increases.

10. The apparatus of claim 7, wherein the at least one temperature sensor includes at least one diode having a forward voltage drop that varies as a function of the temperature of the DRAM array, and the signal corresponds to the forward voltage drop of the at least one diode.

11. The apparatus of claim 10, wherein the refresh unit is operable to sense the forward voltage drop of the diode to determine the temperature of the DRAM array.

12. The apparatus of claim 6, wherein the DRAM array, the at least one temperature sensor, and the refresh unit are integrated in a semiconductor package.

13. A dynamic random access memory (DRAM) chipset, comprising:
at least one DRAM chip including a DRAM array and at least one temperature sensor in thermal communication with the DRAM array, the at least one temperature sensor being operable to produce a signal indicative of a temperature of the DRAM array, the DRAM chip including at least one connection pin operable to provide the signal to external circuitry; and
at least one refresh chip operable to refresh the DRAM array at a rate that varies in response to the signal, wherein the refresh chip is operable to (i) decrease the rate at which the DRAM array is refreshed as the signal indicates that the temperature of the DRAM array decreases; and (ii) increase the rate at which the DRAM array is refreshed as the signal indicates that the temperature of the DRAM array increases.

14. The apparatus of claim 13, wherein the at least one temperature sensor includes at least one diode having a forward voltage drop that varies as a function of the temperature of the DRAM array, and the signal corresponds to the forward voltage drop of the at least one diode.

15. The apparatus of claim 14, wherein the refresh chip is operable to sense the forward voltage drop of the diode to determine the temperature of the DRAM array.

16. A method, comprising:
sensing a temperature of a dynamic random access memory (DRAM) array;
outputting a signal indicative of the temperature of the DRAM array to external circuitry; and
refreshing contents of the DRAM array at a rate that (i) decreases as the temperature of the DRAM array decreases; and (ii) increases as the temperature of the DRAM array increase.

17. The method of claim 16, wherein the step of sensing the temperature of the DRAM array includes sensing a forward voltage drop of a diode that is in thermal communication with the DRAM array.

\* \* \* \* \*